United States Patent [19]
Kiwada et al.

[11] Patent Number: 6,063,301
[45] Date of Patent: May 16, 2000

[54] CRYSTAL DISPLAY PROCESSING METHOD AND CRYSTAL WAFER MANUFACTURING METHOD

[75] Inventors: Kazunori Kiwada; Kazushige Umetsu; Katsumi Suzuki; Itaru Nagai, all of Nagano, Japan

[73] Assignee: Seiko Epson Corporation, Tokyo, Japan

[21] Appl. No.: 09/049,292

[22] Filed: Mar. 27, 1998

[51] Int. Cl.[7] ........................................... B44C 1/22
[52] U.S. Cl. ........................... 216/103; 216/99; 134/1.3; 134/902; 438/906
[58] Field of Search ................................. 216/96, 99, 103; 438/756, 906; 134/1.3, 3, 902

[56] References Cited

U.S. PATENT DOCUMENTS

| | | | |
|---|---|---|---|
| 4,411,731 | 10/1983 | Miller | 216/95 |
| 4,760,351 | 7/1988 | Newell et al. | 331/48 |
| 4,795,582 | 1/1989 | Ohmi et al. | 252/79.3 |
| 5,071,776 | 12/1991 | Matsushita et al. | 438/460 |
| 5,855,811 | 1/1999 | Grieger et al. | 252/79.3 |
| 5,911,889 | 6/1999 | Fabry et al. | 219/90 |

FOREIGN PATENT DOCUMENTS

| | | |
|---|---|---|
| 54-32287 | 3/1979 | Japan . |
| 2-30207 | 1/1990 | Japan . |
| 7-109200 | 4/1995 | Japan . |

*Primary Examiner*—Randy Gulakowski
*Assistant Examiner*—Shamim Ahmed
*Attorney, Agent, or Firm*—Oliff & Berridge, PLC

[57] ABSTRACT

A method of smoothly processing a surface of crystal material, particularly a quartz crystal, to attain a good surface roughness and degree of eveness without substantial hillocks or micro-projections, without performing grinding or polishing processing. After lapping the surface of the crystal material, the lapped surface is etched with hydrofluoric acid. Finish etching is performed on the crystal material by buffer hydrofluoric acid as needed. In the manufacture of a crystal piece used in a crystal device, after the crystal wafer cut out from the rough crystal stone to the specified thickness is lapped, it is roughly etched to the desired thickness by hydrofluoric acid. Then, after ultrasonic washing by pure water, the crystal wafer is processed to the desired high quality of surface roughness, level of smoothness and thickness. The surface processing can be performed more easily, in less time, and with less labor than conventional methods, the cost is decreased, and productivity rises. In the manufacture of crystal resonator pieces, a rise in yield can be achieved.

20 Claims, 11 Drawing Sheets

PRIOR ART

CRYSTAL DISPLAY PROCESSING METHOD AND CRYSTAL WAFER MANUFACTURING METHOD

BACKGROUND OF THE INVENTION

1. Field of the Invention

The invention relates to surface processing of a crystal in manufacturing a crystal device such as, for example, a tuning fork crystal resonator, a longitudinal mode crystal resonator or crystal sensor, a crystal filter or the like, and relates especially to surface processing of a crystal suitable in the manufacture of crystal pieces in which desired shapes are formed using photolithography technology in the etching process of a crystal wafer.

2. Description of Related Art

Conventionally, crystals (synthetic crystals) are used in various devices such as resonators, generators, filters, sensors and the like, in fields of various electrical appliances including communication equipment such as cellular telephones, pagers, and the like; various electronic control devices and data equipment such as computers, word processors, and the like; and general appliances such as electrical clocks, video cameras, and the like. Among these, tuning fork type crystal resonators are widely used as a clock source of these electrical appliances.

Generally, the manufacture of the tuning fork type crystal resonator comprises a first process of wafer processing in which the rough crystal stone is first cut into a block shape, a wafer of specified thickness is then cut out, and lastly, mirror-like finishing is performed on the surface to achieve a wafer of desired thickness. A process of etching processing then forms the wafer into a tuning fork crystal resonator piece by etching using photolithography technology on which electrodes and wiring patterns are film-formed. Finally, a process is conducted in which the obtained crystal resonator piece is sealed into a vacuum case after being mounted in, for example, a plug comprising a hermetic terminal, and the frequency is adjusted.

Figure 9:
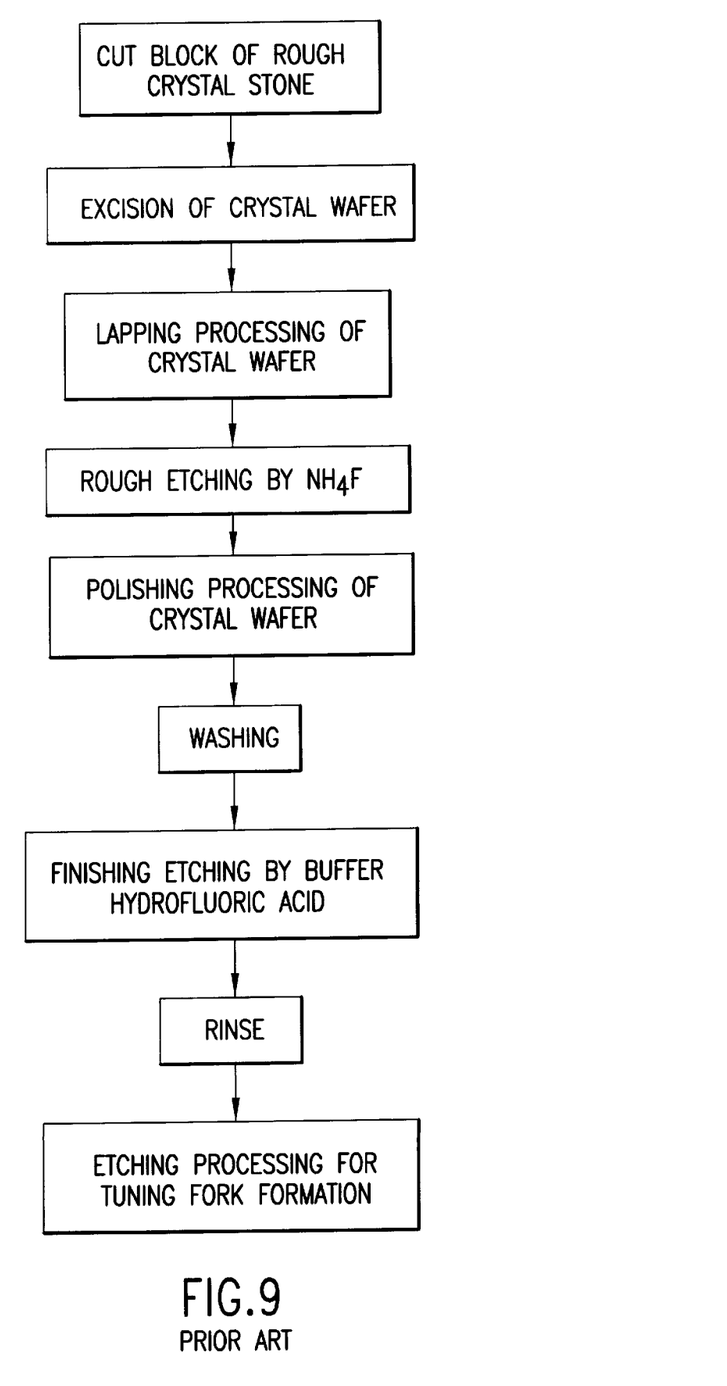
FIG. 9 is a flow diagram showing the process for producing a conventional crystal wafer.

In such process of wafer processing, as shown in the flow chart of FIG. 9, after cutting out the crystal wafer, both surfaces of the crystal wafer are lapping processed in order to make the diameter of the grain fine, to remove the cutting processing layer which is generated at that time and to obtain a pre-determined layer thickness. By doing this, the aforementioned surface of the wafer becomes a dull glass-like lap processed surface which has a comparatively rough surface. Next, the layer deteriorated by lapping (or processing-deteriorated layer) is removed and the crystal washed and simultaneously adjusted to the desired thickness through etching of the wafer with ammonium fluoride ($NH_4F$) solvent. By doing this, even though extremely fine roughness still exists, a so-called satin-like surface (hereafter, "satin finish surface") can be obtained on the aforementioned wafer surface.

Figure 10A:
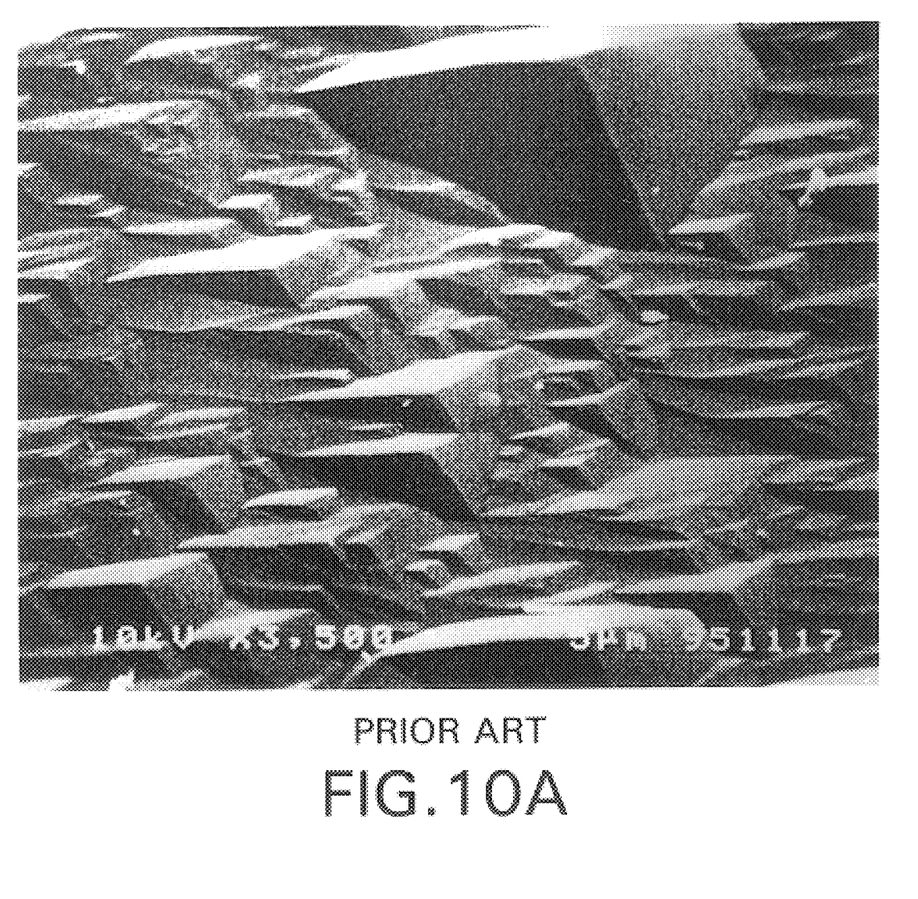
FIG. 10(A) is a photograph, enlarged 3500 times, of the surface state of the crystal wafer after rough etching by an $NH_4F$ aqueous solution.
Figure 10B:
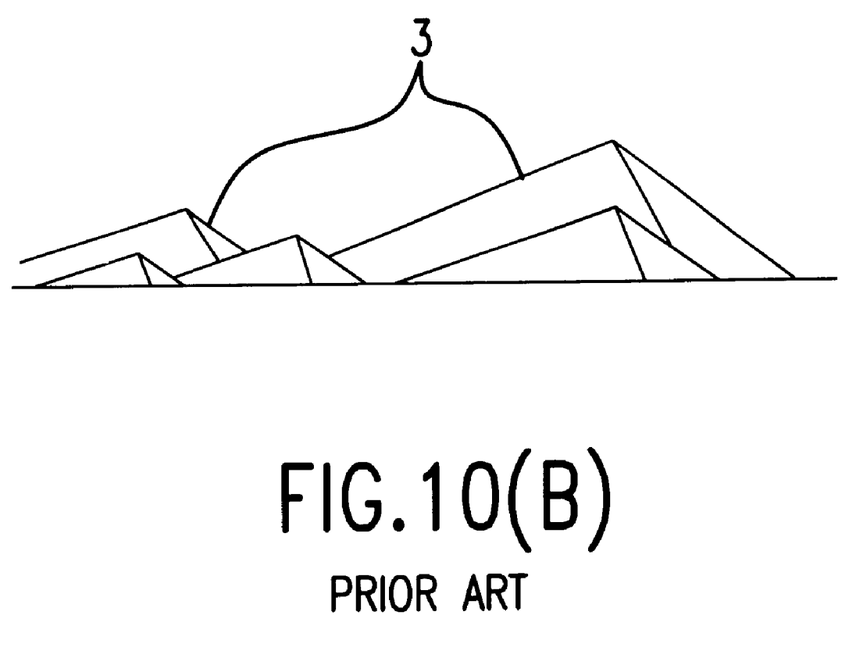
FIG. 10(B) is a patterned diagram of the surface state of FIG. 10(A) as seen from the side.

When lapping occurs with a grit of approximately GC#2000, an etching amount of approximately 10 $\mu$m is necessary on each wafer surface in order to remove the process-deteriorated layer. However, when the etching amount with $NH_4F$ is this great, many triangular pyramid-shaped protrusions 3, as seen in FIGS. 10(A) and 10(B), which are called hillocks, are generated on the aforementioned wafer surface corresponding to the direction of the crystal faces of the crystal. These grow larger along with the etching time and at the same time, their numbers are increased. Therefore, the wafer surface cannot be maintained at the same quality as the satin finish surface, and a sufficient quality of the rough surface cannot be obtained in order to form the corrosion film in the later processing and to perform the etching processing of a tuning fork.

Therefore, conventionally, polishing processes are performed by an abrasive material in which very fine grain such as silica and cerium oxide or an etching solution is mixed, and the wafer surface is processed to a high quality mirror surface state by removing hillocks. Moreover, after washing the wafer, it is lightly etched by a mixture solvent of hydrofluoric acid and fluorine ammonium (hereafter, "buffer hydrofluoric acid") (the etching amount of the each surface is approximately 0.5–1 $\mu$m), and processing irregularities from the polishing process are removed, and finally, the aforementioned wafer is finished to the desired high quality mirror state having a flatness and a thickness. After that, this wafer is rinsed and finished, and checked for dirt, scratches, and scars. By doing this, at the later etching processing to form the tuning fork, a sufficient amount of adherence is obtained between the wafer surface and the corrosion film which is formed on the wafer surface.

However, in the prior crystal manufacturing method of the tuning fork type crystal resonator piece using surface processing as described above, in the wafer processing process, the time required for the polishing process of the wafer is extremely long and the thickness of the wafer is already thin by etching with the $NH_4F$ solution. Therefore, the following problems exist. Any damage such as cracking, breaking, or the like easily occurs on the wafer when polishing. The processing work is delicate and troublesome and requires a great amount of work. Simultaneously, the yield decreases and the manufacturing cost increases.

SUMMARY OF THE INVENTION

Therefore, the present invention is developed, reflecting upon the prior problems as described above, and an objective is to provide a surface processing method of a crystal in which a desirable surface roughness and a degree of flatness in which hillocks and minute projections substantially do not exist, and which is easily obtained without performing a polishing process but has the same effect as a polishing process.

Furthermore, another objective of the present invention is to enable the omission of prior polishing processes in the wafer processing in the manufacturing method of a crystal piece in which a crystal wafer is shaped into a desired state by an etching process. By so doing, the time required for the wafer process can be shortened, the work can be simplified and the amount of work decreased, and an improvement in the yield and a decrease in the manufacturing cost can be realized.

Furthermore, the present invention is to provide a simple method at an inexpensive cost which can process the crystal piece with a desirable surface roughness, degree of flatness and thickness in which hillocks or minute projections substantially do not exist so as to be of the same quality as crystal pieces obtained with the prior polishing process. In particular, an objective of the present invention is to provide a preferable method for the manufacture of a tuning fork type crystal resonator piece.

The surface processing method of a crystal of the present invention achieves the foregoing and other objectives, and includes a process of lapping the surface of the crystal material and a process which etches the surface of the lapped crystal materials with hydrofluoric acid.

DETAILED DESCRIPTION OF PREFERRED EMBODIMENTS

Crystal surfaces, for example preferably crystalline wafer surfaces, suitable for processing by the present methods include quartz crystals.

Hydrofluoric acid can be used as an etching agent, just like a $NH_4F$ solution, to dissolve crystal under normal temperatures and pressures. The $NH_4F$ solution and $NH_4F$ group etching solutions develop hillocks on the etching surface, and these grow larger in accordance with the etching amount, while hydrofluoric acid is maintained in an approximately constant state regardless of the etching amount on the etching surface. Because of this, according to the present invention, the lapping processed surface of the crystal material can be made to be a satin finished surface in which concavities and convexities are extremely minute and the scattering reflection of light is relatively less through hydrofluoric acid etching. Furthermore, regardless of the etching amount, a desirable satin finished surface state can be continuously maintained at an approximately constant quality without hillocks. Therefore, by merely using the etching process of the crystal material, the process altered layer (processing-deteriorated layer) from lapping can be eliminated and a surface state can be obtained which has a high quality flatness corresponding to desired usage requirements, usage conditions, and the like of the crystal material. Thus, polishing processes can be eliminated.

In the etching process of the crystal material surface by hydrofluoric acid, if the etching solution contains hydrofluoric acid and an interface activator, the surface tension may be decreased, a more even etching process may be performed, and a more homogeneous surface state as a whole can be conveniently obtained.

Furthermore, the surface processing method of a crystal of the present invention preferably further includes finishing and etching the crystal material with buffer hydrofluoric acid after etching with hydrofluoric acid. In general, etching with hydrofluoric acid easily develops minute nipple-like projections on the etching surface of the crystal material, and the flatness of the satin finished surface can be lost. Therefore, by performing light finish etching with the buffer hydrofluoric acid to a degree at which hillocks are not developed, any minute projections formed by etching can be eliminated, and a so-called delustered surface which is more flat at a higher quality than the satin finished surface can be attained.

Furthermore, a manufacturing method of a crystal piece is provided that includes a process which laps a crystal wafer of a predetermined dimension, a process which etches the lapped crystal wafer to a desired thickness with hydrofluoric acid, and a process which forms the crystal wafer etched by the hydrofluoric acid to a desired form by etching.

The processing altered layer formed by lapping is removed from the lapped process surface of the lapped crystal wafer and the wafer is adjusted to the desired thickness by the etching process with hydrofluoric acid, and a satin finished surface of a high quality which satisfies the required flatness can be attained by subsequent etching forming processing to a desired form. Also, in this case, in the etching process of the crystal wafer with hydrofluoric acid, if the etching solution contains both hydrofluoric acid and an interface activator, a more homogeneous surface state can be conveniently attained by a more uniform etching process.

The hydrofluoric acid is preferably included in an aqueous-based etching solution. The concentration of hydrofluoric acid in the aqueous-based etching solution is, for example, less than 50% by weight, preferably 30 to 50% by weight, most preferably 35 to 50% by weight.

If interface activators are included in the etching solution, such interface activators may be any known cation-based or non-ion-based interface activators. The interface activators may be present in an amount of from, for example, 0 to 3 vol %, preferably 0.1 to 1 vol %, most preferably about 1 vol %.

Etching with the hydrofluoric acid should continue, for example, for at least a time sufficient to remove the processing-deteriorated layer formed by lapping. A suitable length of time may be, for example, about 5 to about 20 minutes, preferably about at least 10 minutes, particularly when lapping is conducted with GC#2000.

Moreover, on the wafer surface, as described above, if nipple-like micro-projections develop through the hydrofluoric acid etching, when etching the crystal wafer in the subsequent forming process, part of the minute projections cannot be covered enough by a resistant film or resist protection film, so that etch pits occur. According to the present invention, if etching is performed while the crystal wafer is vibrated in the hydrofluoric acid etching solution, the development of the minute projections can be conveniently controlled.

Furthermore, the manufacturing method of the crystal piece of the present invention includes a process which etches by buffer hydrofluoric acid before forming the rough etched crystal wafer into the desired form. By lightly finish etching with the buffer hydrofluoric acid to a degree such that hillocks are not developed, any minute projections which are developed on the surface of the crystal wafer during etching with hydrofluoric acid are eliminated, the wafer surface is processed to be more flat, and a flatter delustered surface than the satin finished surface can be attained.

The buffer hydrofluoric acid preferably includes, for example, a hydrofluoric acid etching solution as discussed above mixed with a water-based solution of $NH_4F$. Any suitable concentrations and mixing ratios may be selected based upon the objects to be achieved by the light finish etching. In a most preferred embodiment, the buffer hydrofluoric acid comprises a 47 wt % aqueous-based solution of hydrofluoric acid mixed at a 1:1 ratio with a 40 wt % aqueous-based solution of $NH_4F$.

The finish etching should continue for a time less than a time at which hillocks develop but sufficient to remove any minute projections formed by the etching with hydrofluoric acid. A suitable time may be, for example, up to about 20 minutes, although shorter or longer times may be used, depending on the composition of the buffer hydrofluoric acid as understood by one of ordinary skill in the art.

Preferably, the crystal wafer which was etched by hydrofluoric acid is cleaned before the finish etching with the buffer hydrofluoric acid. By so doing, after etching with hydrofluoric acid, extraneous materials and blemishes which are deposited or attached to the crystal wafer surface can be eliminated in advance. Therefore, it is possible to effectively perform a better finish etching. In particular, by ultrasonic cleaning using pure water, it is possible to eliminate microdeposits, extraneous materials, and blemishes from the crystal wafer surface which cannot be eliminated easily by etching with the buffer hydrofluoric acid.

According to the present invention, by film-forming electrode and wiring patterns using known photolithography technology, crystal element pieces that form crystal devices such as crystal resonators, crystal sensors, crystal filters, and the like can be attained on the surface of the crystal wafer which is formed into a desired form as described above. In particular, by forming the crystal wafer to a tuning fork shape, a crystal resonator piece for a tuning fork type crystal resonator can be attained.

When the etching process is performed on the crystal wafer in desired state other than a tuning fork state, according to the present invention, it is convenient if a double-layer corrosion resistant film comprising a Cr film overlain by an Au film is formed on the flat crystal wafer surface which was obtained from the above process. Furthermore, according to the present invention, if forming the photoresist film to be thick on the corrosion resistant film, part of the hillocks and micro-projections can be covered enough and protected by the photoresist film and the development of etch pits can be conveniently prevented.

The following, in reference to the drawings, provides a detailed explanation using preferred embodiments.

Figure 1:
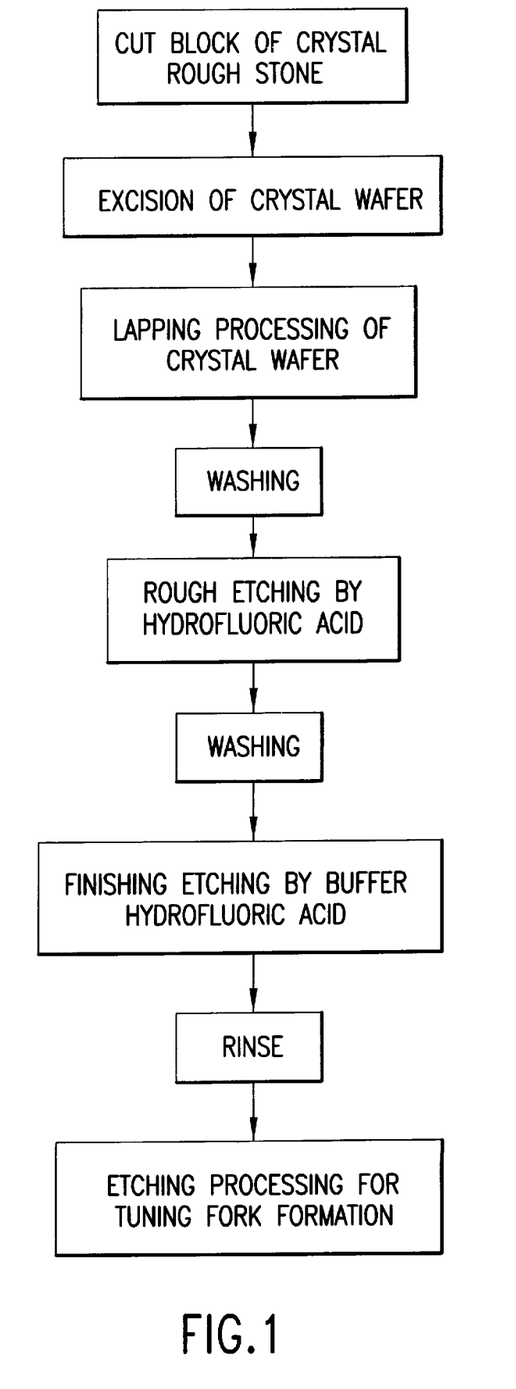
FIG. 1 is a flow diagram showing the process for producing crystal wafers by the method of this invention.

FIG. 1 shows a preferred embodiment of the manufacturing process of the tuning fork type crystal vibration plate according to this invention. First of all, in reference to FIG. 9, similar to the above explained conventional process, after cutting a rough stone of synthetic crystal into a block of specified measurement and forming, chamfering, and grinding it, a wafer of specified thickness is cut using, for example, a multi-blade saw. The thickness of this cut crystal wafer is determined by considering the amount of material to be removed in subsequent lapping and/or etching processes. Next, lapping is performed as conventional to the art using, for example, a double-sided polisher, and while gradually switching from course grit to fine grit (for example, GC#2000 level), the processed layer generated during the wafer cutting is removed, resulting in processing of the wafer to a specified thickness and surface condition. The dull glass state of a relatively rough surface condition is achieved at this time, and is called a lap processed surface as described above.

According to these embodiments, a crystal wafer which has finished the lapping process is washed, then roughly etched using an etching solution of hydrofluoric acid. If a slight amount of surfactant is added to the hydrofluoric acid at this time, the surface tension of the etching solution decreases and the temperature is adjusted to approximately 45° C., and it is possible to perform uniform etching on the lap processed side of the wafer. By this rough etching, the process deteriorated layer is removed from the surface of the crystal wafer and the wafer is adjusted to the desired thickness. The etching amount is set such that it is possible to remove the process deteriorated layer which occurred during the lapping process. For example, when the wafer is lap processed with a normal grit of, for example, GC#2000, it is necessary to remove, for example, approximately 10 $\mu$m or more from at least one side of the wafer.

Next, in these embodiments, after the wafer surface is washed, etching by buffer hydrofluoric acid is performed followed by finishing processing. In the manufacture of the crystal vibration plate especially, because of its characteristics, an ultrasonic wash using highly pure water is desirable. In other embodiments, ethanol, isopropyl alcohol or the like may be substituted for pure water. Buffer hydrofluoric acid is an etching solution of the $NH_4F$ group, so an etching amount of several $\mu$m, for example 5 $\mu$m, from one side is a good condition to prevent hillocks.

It is known that hydrofluoric acid is an etching agent which dissolves crystal under normal temperatures and pressures in the same manner as the $NH_4F$ water soluble solution described above. The surface state of a wafer obtained by the rough etching is the surface described above in which there are extremely minute bumps, but the diffused reflection of some light is smaller and the surface is better than the etching surface with a conventional $NH_4F$ water soluble solution. When etching with $NH_4F$ water soluble solution, hillocks increase in proportion to the etching time as described above, and the etching surface state is rougher. In contrast, in the case of hydrofluoric acid, the etching surface state does not depend on the etching amount, but is uniform. Because of this, the advantage of rough etching with hydrofluoric acid is that it can always obtain a surface state of specified quality even if the etching amount differs in each wafer, and can maintain the obtained surface state.

Figure 2A:
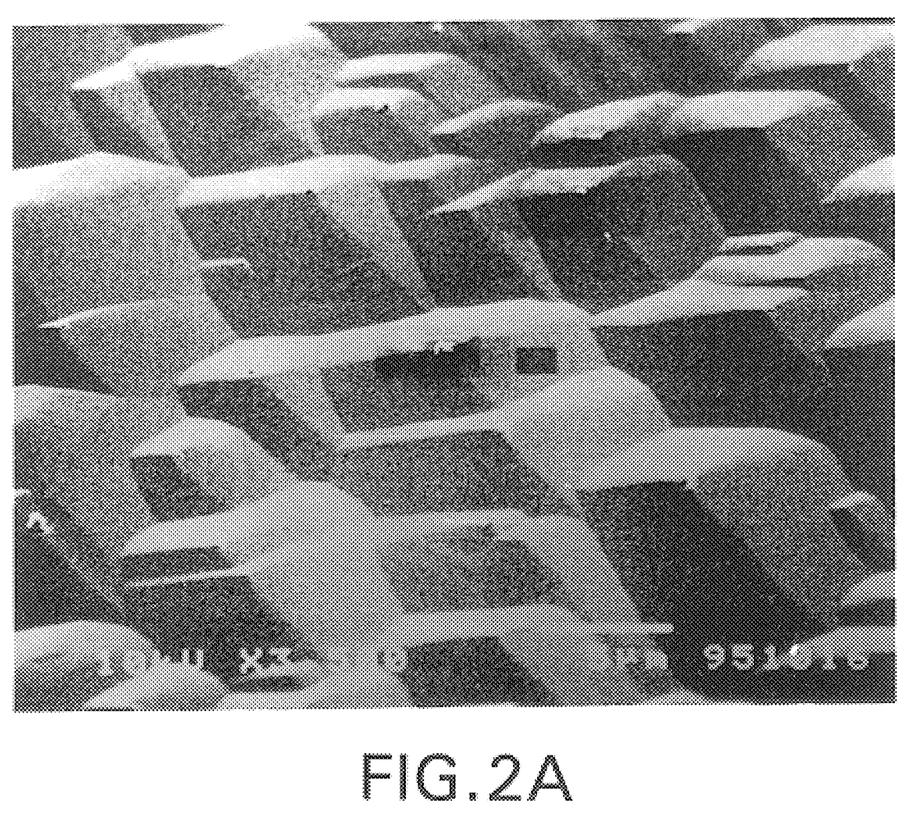
FIG. 2(A) is a photograph, magnified 3500 times, of the surface condition of a crystal wafer after rough etching by hydrofluoric acid.
Figure 2B:
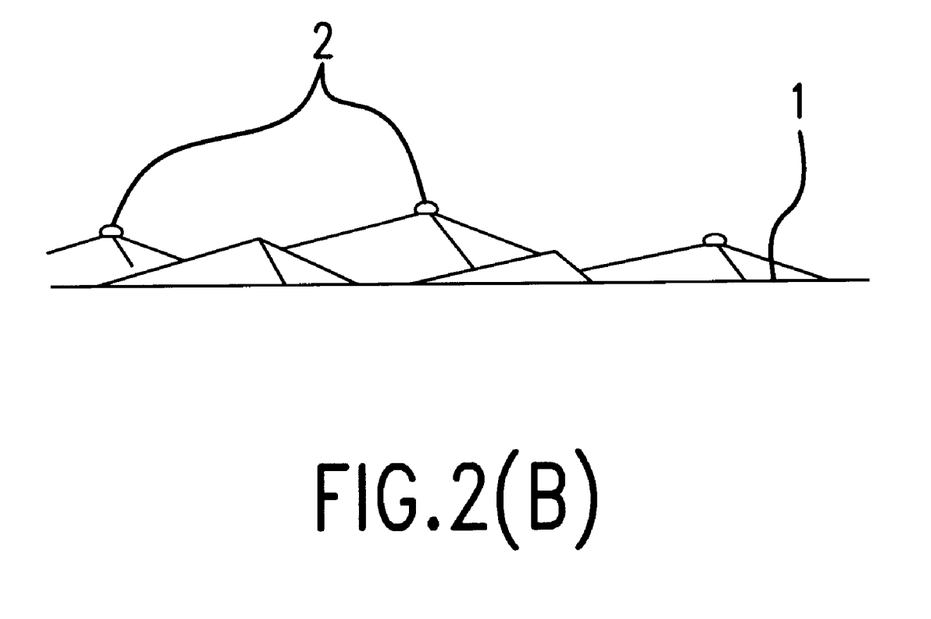
FIG. 2(B) is a patterned diagram of the surface state of FIG. 2(A) as seen from the side.

However, when etching with hydrofluoric acid, nipple-like micro-projections are likely to occur on etching side 1 of the crystal wafer as shown in FIGS. 2(A) and (B). These micro-projections 2 are formed as projecting from the peaks of the crystalline structure of the crystals emerging in triangular pyramidal formations on the etching side. As a result, in the succeeding work, since the etching process is performed in a tuning fork formation, a corrosion resisting film is formed on the wafer surface, and since this corrosion resisting film is thin or not film formed at all on the micro-projection portions, these portions are eroded by the etching solution, and etch pits occur on the wafer surface. It is desirable to perform the rough etching while moving or vibrating the crystal wafer in the hydrofluoric acid in order to control the occurrence of the micro-projections.

According to this invention, by performing finish etching with buffer hydrofluoric acid after rough etching with hydrofluoric acid, it is possible to remove micro-projections which have occurred on the crystal wafer surface and to process the wafer surface more evenly. The surface state of a wafer obtained by such method is not a mirror-like surface as obtained from the conventional grinding process, but is a matted surface sufficiently fulfilling the required smoothness by the etching process of the tuning fork formation with less bumps and even less diffused reflection light than the aforementioned satin surface.

Especially in this embodiment, by washing the crystal wafer surface before the finish etching with buffer hydrofluoric acid, it has been confirmed that the occurrence of micro-projections caused by micro-particles or dirt existing on the wafer surface of the finish etching can be prevented. It is thought that this is because, among the micro-particles or dirt which have precipitated and stuck to the wafer surface after rough etching by hydrofluoric acid, the micro particles which cannot be easily removed even by buffer hydrofluoric acid are removed, and a matted surface of sufficient smoothness and more certainly even higher quality is obtained.

Figure 3:
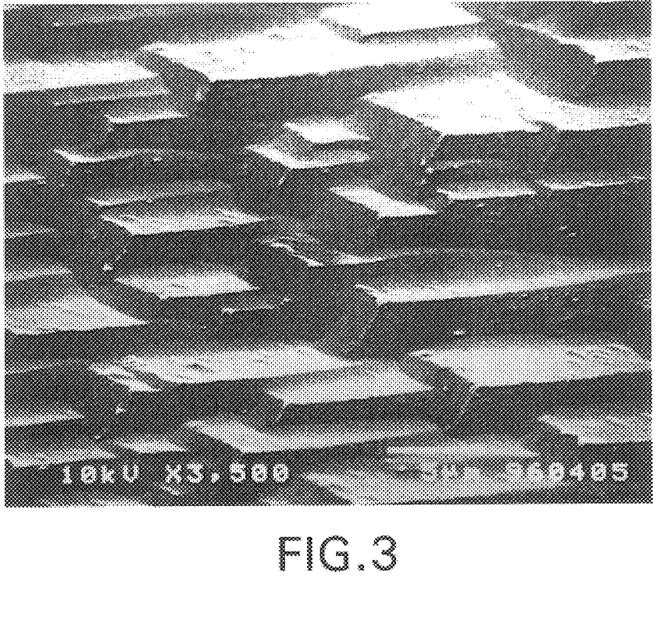
FIG. 3 is a photograph, magnified 3500 times, of the surface state after etching of 1.0 μm by buffer hydrofluoric acid is performed on the crystal wafer of FIG. 2(A).
Figure 4:
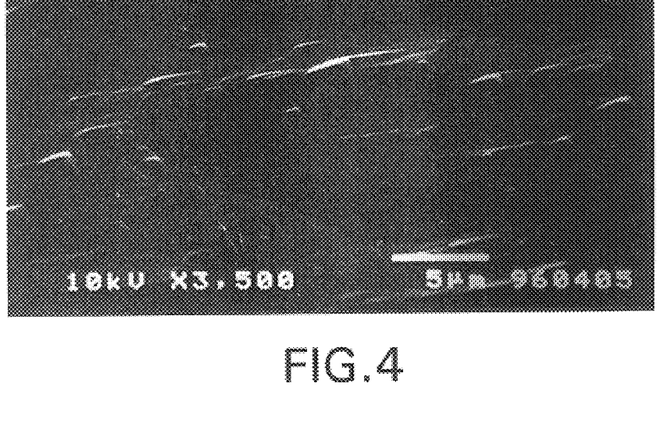
FIG. 4 is a photograph, magnified 3500 times, of the surface state after etching of 3.5 μm by buffer hydrofluoric acid is performed on the crystal wafer of FIG. 2(A).

FIG. 3 shows the surface state after a 1.0 $\mu$m etching amount of finish etching has been performed by buffer hydrofluoric acid on the crystal wafer of FIG. 2(A). At this point, the micro-projections have been substantially removed, but the smoothness is about the same as the satin finish that results after the aforementioned rough etching, and is not very high. FIG. 4 shows the surface state of finish etching continued to an etching amount of 3.5 $\mu$m by buffer hydrofluoric acid. The micro-projections are completely dissolved and the entire surface is smoother. The number of small hillocks occurring is not a utility problem, and there are absolutely no hillocks of a size which causes the occurrence of etch pits by the etching process of the tuning fork formation.

Figure 5:
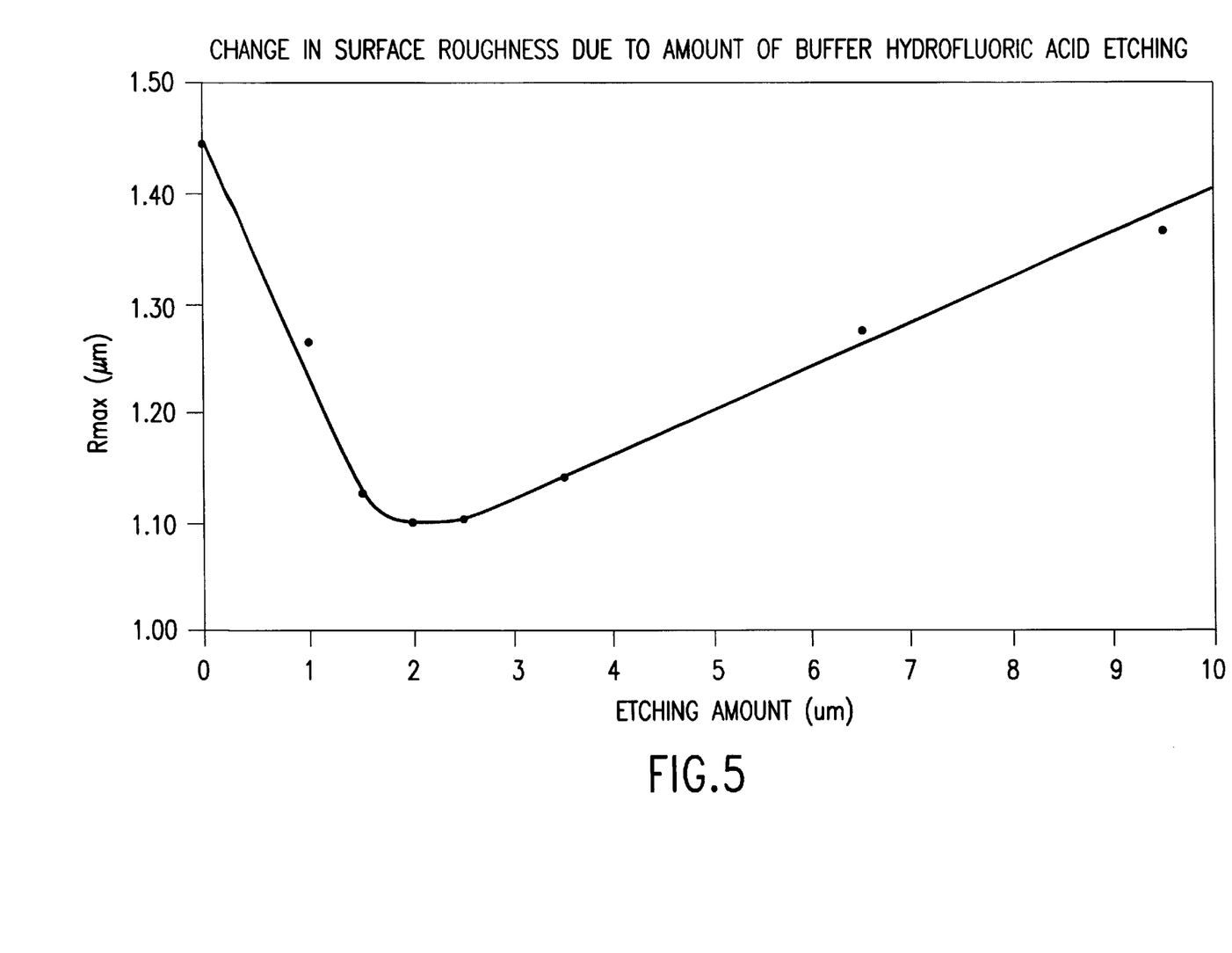
FIG. 5 is a line graph showing the change in maximum value in surface roughness (Rmax) resulting from the etching amount by buffer hydrofluoric acid on the wafer.
Figure 6:
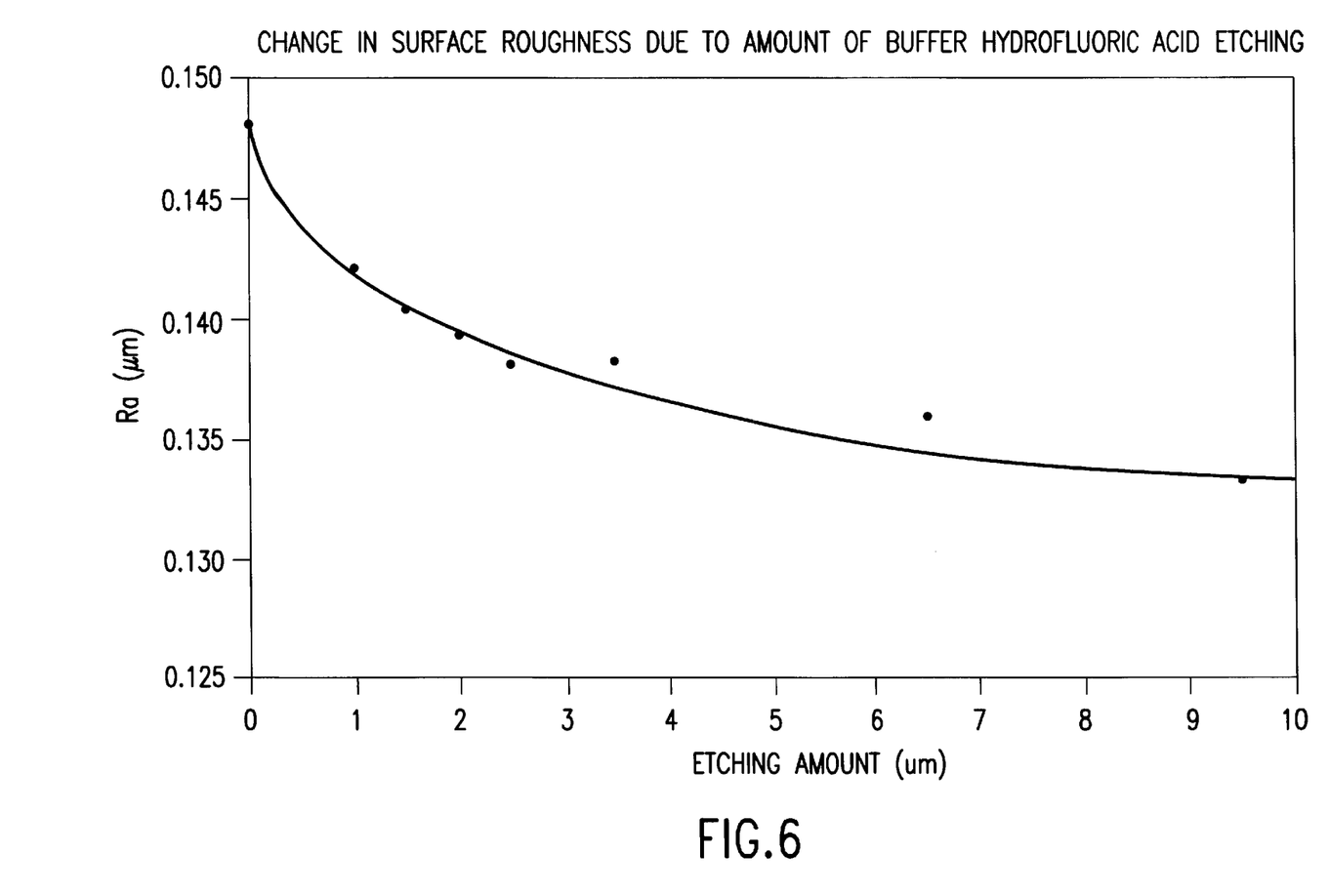
FIG. 6 is a line graph showing the change in average value in surface roughness (Ra) resulting from the etching amount by buffer hydrofluoric acid on the wafer.
Figure 7:
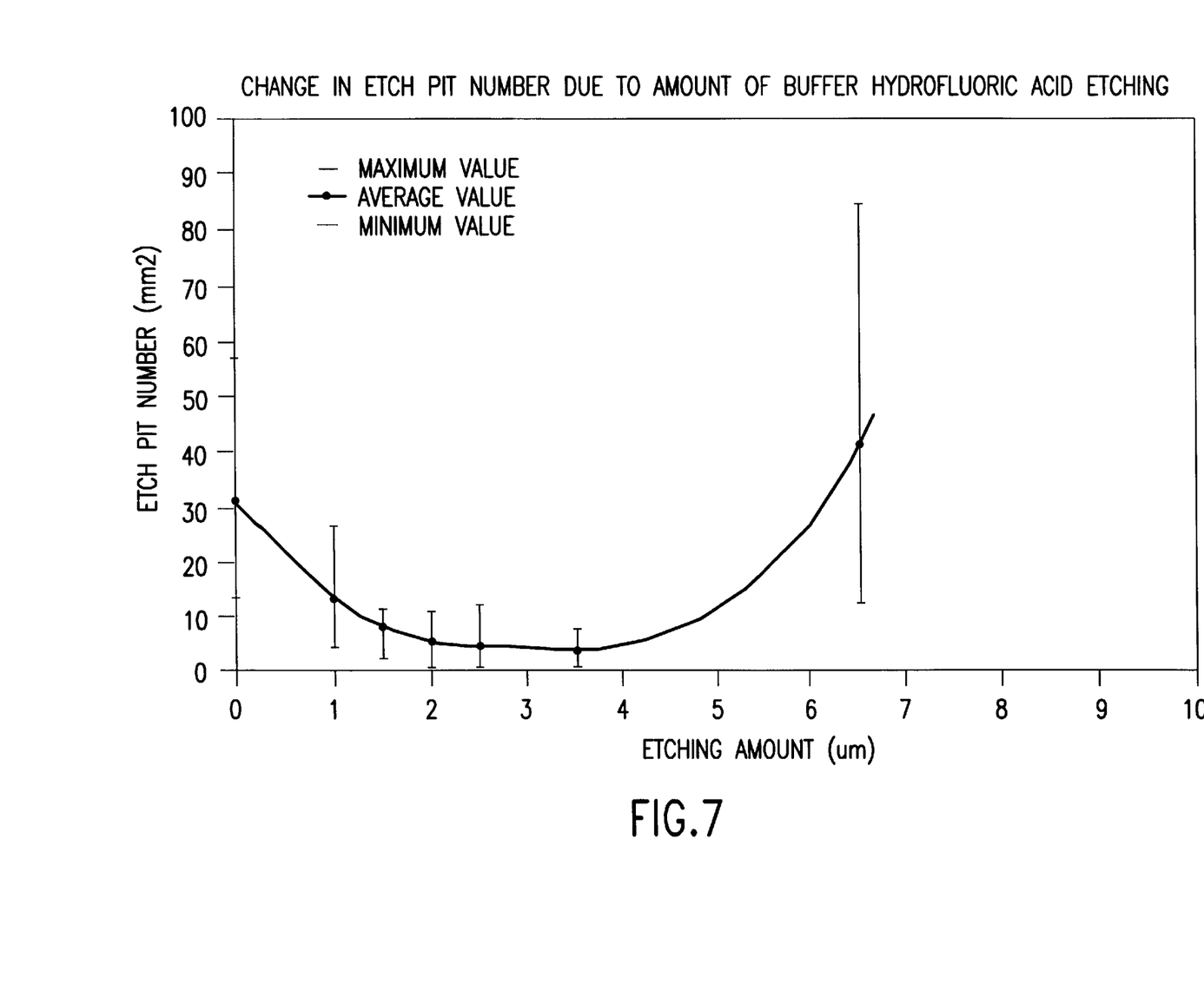
FIG. 7 is a line graph showing the change in etch pit number in a unit area resulting from the etching amount by buffer hydrofluoric acid on the wafer.

When the crystal wafer was etched by buffer hydrofluoric acid, an experiment to measure the roughness of the wafer surface in regard to the etching amount was performed. FIG. 5 shows the change in surface roughness, namely the maximum value of the bumps (Rmax), in regard to the etching amount, and FIG. 6, likewise, shows the change in average value of the bumps (Ra) in regard to the etching amount. Furthermore, when etching processing was performed in the tuning fork formation in processing after the crystal wafer was etched by buffer hydrofluoric acid, an experiment to measure the occurrence of etch pits in regard to the etching amount was performed. FIG. 7 shows the change in the number of etch pits per unit area (1 mm$^2$) in regard to the etching amount. From the results of these experiments, it is understood that an etching amount in the range of approximately 1.5–4 $\mu$m is preferred because it has the smallest bumps, the fewest number of etch pits, and the lowest dispersion.

Figure 8:
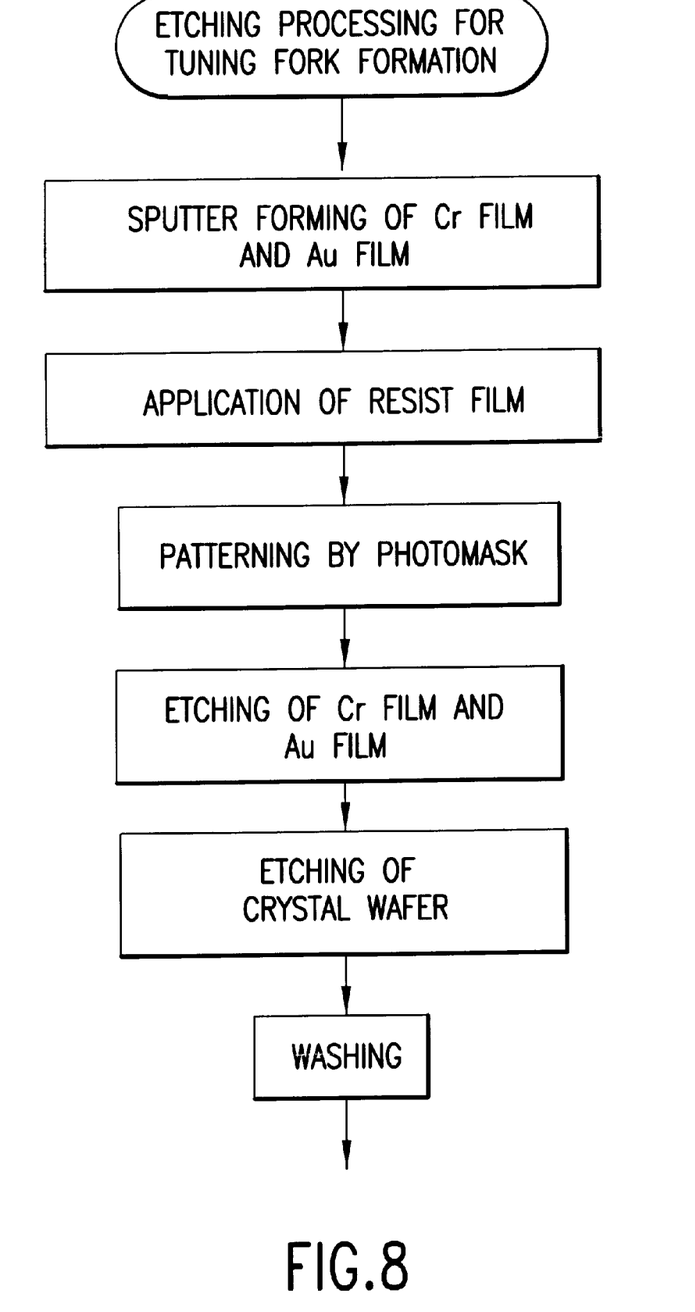
FIG. 8 is a flow diagram, in continuation of FIG. 1, showing the process for tuning fork formation with the crystal wafer formed by the wafer processing method of this invention.

After a crystal wafer of such completed rough etching and finish etching has been washed of the etching solution in the rinse, the etching processing is performed in the tuning fork formation according to the process shown in FIG. 8. First of all, a corrosion resisting film is formed by sputtering Cr film and Au film on both the top and bottom sides of the wafer. The Cr film and the Au film can also be formed by vacuum evaporation. Next, a resist film is applied onto the corrosion resisting film, and after pre-baking, a photo mask is used and both top and bottom sides are exposed, developed, post-baked at a specified temperature, and patterning is performed in a specified tuning fork formation. This resist film acts as a protective film as the corrosion resisting film is etched and patterning is performed in the tuning fork formation. According to this invention, the resist film is thicker than normal on the corrosion resisting film, for example, a film formed in a thickness of approximately 1–2 $\mu$m is acceptable. Therefore, when the crystal wafer in the tuning fork formation is etched in a subsequent process, the Cr film and the Au film are protected by a thick resist film on the hillock and micro-projection areas, so the occurrence of etch pits is avoided.

Next, the hydrofluoric acid etches the crystal wafer as an etching solution, and forms the crystal wafer in a tuning fork formation. Furthermore, the resist film, Cr film and Au film remaining on the wafer are exfoliated, washed, and a crystal wafer using the desired tuning fork formation is obtained. Lastly, by forming the Cr film and the Au film in each element of the tuning fork formation by sputtering, an electrode film is formed, and as in the conventional method, photolithography technology is used and specified electrodes and wiring patterns are formed. The crystal vibration plate obtained by this method is mounted to a plug comprising a hermetic terminal, and after frequency adjustment is performed, is vacuum sealed into a cylindrical metal case, and the tuning fork type crystal resonator is completed.

In the above, details were explained using preferred embodiments with respect to the invention, but as is clear to the manufacturers, it is possible to perform various replacements and changes to the above explained embodiments within the technological scope of the invention. That is, based on the etching process of crystal wafers using photolithography technology not only in the manufacturing of the tuning fork type crystal resonator, but also in the manufacture of various types of crystal devices such as the longitudinal mode crystal resonator and crystal oscillator, the crystal sensor, and the crystal filter, when manufacturing the crystal piece by forming into a desired formation, it can be done using the same method. Furthermore, according to the use of crystal as a material, it is possible to apply this invention to various fields in which high quality surface production without the above mentioned hillocks or micro-projections is necessary. For the wash performed after the etching by hydrofluoric acid and before the finish etching, depending on the use and the processing conditions of crystal, it is possible to use methods other than the above explained pure water ultrasonic wash, such as methods of fanning or various methods of washing pure water on the crystal surface with an impact, as required.

The invention is structured as stated above, so the results as described below take effect.

In the crystal surface processing method of the invention, by carrying out an etching process by hydrofluoric acid on a crystal material which has been processed by lapping, the removal of the process-deteriorated layer from lapping is possible without grinding, and a smooth, satin surface without hillocks can be achieved. As needed, after etching by hydrofluoric acid, by performing finish etching by buffer hydrofluoric acid, hillocks and the nipple-like micro-projections occurring due to hydrofluoric acid etching are removed, and a smoother, dull surface is achieved. It is possible to relatively easily achieve a surface state which satisfies the application, condition of use, and the like of the crystal material as needed, so a great reduction in the time required for surface processing, labor reduction, and cost reduction can be accomplished.

According to the manufacturing method of the crystal piece of the invention, after the lapping process of the crystal wafer, a conversion to the conventional NH$_4$F solution can be made, and the conventional polishing process can be omitted by etching to the desired thickness by hydrofluoric acid. By the mere etching process of the crystal wafer, the process-deteriorated layer is removed by lapping simultaneously with adjusting the wafer to a desired thickness. Afterward, a surface which satisfies the degree of smoothness required in the etching process for the desired tuning fork shape can be obtained, so the time required in wafer processing is greatly shortened, the work is simplified and labor is reduced, and a rise in yield and a decrease in manufacturing cost can be achieved.

According to the invention, by etching a crystal wafer, which has been etch processed by hydrofluoric acid, by the buffer hydrofluoric acid to a point such that hillocks do not occur and performing the finishing process, or by performing the finishing process after washing, a satin finished surface obtained by hydrofluoric acid etching can be processed more smoothly, and the occurrence of etch pits in the wafer surface from the etching process of the resulting specified formation can be eliminated, so the yield can be increased even more.

What is claimed is:

1. A crystal surface processing method comprising lapping a surface of a crystal material, subsequently etching the surface of the crystal material with hydrofluoric acid, and subsequently finish etching the surface of the crystal material with a buffer hydrofluoric acid without conducting a polishing process during the crystal surface processing method.

2. The crystal surface processing method as set forth in claim 1, further comprising washing the surface of the crystal material following the etching with hydrofluoric acid but before the finish etching with the buffer hydrofluoric acid.

3. The crystal surface processing method as set forth in claim 2, the washing comprising an ultrasonic wash with pure water.

4. The crystal surface processing method as set forth in claim 1, the finish etching continuing for a time less than a time at which hillocks develop but sufficient to remove any minute projections formed by the etching with the hydrofluoric acid.

5. The crystal surface processing method as set forth in claim 1, the hydrofluoric acid comprising an etching solution further containing a surfactant.

6. The crystal surface processing method as set forth in claim 1, the crystal material comprising a quartz crystal.

7. A manufacturing method of a crystal piece comprising crystal surface processing a crystal wafer having specified dimensions by lapping the crystal wafer, subsequently etching the crystal wafer to a desired thickness with hydrofluoric acid, and subsequently finish etching the crystal wafer with a buffer hydrofluoric acid without conducting a polishing process during the crystal surface processing, and subsequent to the finish etching of the crystal wafer, shaping the crystal wafer to a desired shape by further etching the crystal wafer.

8. The manufacturing method of a crystal piece as set forth in claim 7, further comprising washing the crystal wafer following the etching with hydrofluoric acid but before the finish etching with the buffer hydrofluoric acid.

9. The manufacturing method of a crystal piece as set forth in claim 8, the washing comprising an ultrasonic wash with pure water.

10. The manufacturing method of a crystal piece as set forth in claim 7, further comprising vibrating the crystal wafer in the hydrofluoric acid during the etching of the crystal wafer with hydrofluoric acid.

11. The manufacturing method of a crystal piece as set forth in claim 7, the hydrofluoric acid comprising an etching solution further containing a surfactant.

12. The manufacturing method of a crystal piece as set forth in claim 7, further comprising film forming electrodes and wiring patterns on a surface of the crystal wafer following the shaping of the crystal wafer to the desired shape.

13. The manufacturing method of a crystal piece as set forth in claim 7, the desired shape being that of a tuning fork of a tuning fork crystal resonator.

14. The manufacturing method of a crystal piece as set forth in claim 7, further comprising forming a corrosion resisting film of Au film layered on Cr film on a surface of the crystal wafer during the shaping of the crystal wafer to the desired shape.

15. The manufacturing method of a crystal piece as set forth in claim 14, further comprising forming a thick photoresist film on the corrosion resisting film during the forming of the crystal wafer to the desired shape.

16. The manufacturing method of a crystal piece as set forth in claim 7, the crystal wafer comprising a crystalline quartz wafer.

17. The crystal surface processing method according to claim 1, wherein the hydrofluoric acid comprises 30 to 50% by weight hydrofluoric acid in an aqueous solution.

18. The crystal surface processing method according to claim 1, wherein the buffer hydrofluoric acid comprises a mixture of hydrofluoric acid and ammonium fluoride in an aqueous solution.

19. The manufacturing method of a crystal piece according to claim 7, wherein the hydrofluoric acid comprises 30 to 50% by weight hydrofluoric acid in an aqueous solution.

20. The manufacturing method of a crystal piece according to claim 7, wherein the buffer hydrofluoric acid comprises a mixture of hydrofluoric acid and ammonium fluoride in an aqueous solution.

* * * * *